United States Patent
Kanazawa et al.

(10) Patent No.: US 7,133,649 B2
(45) Date of Patent: Nov. 7, 2006

(54) NEGATIVE FEEDBACK AMPLIFIER FOR TRANSMITTER, TRANSMITTER, AND METHOD OF CORRECTING ERROR IN THE NEGATIVE FEEDBACK AMPLIFIER

(75) Inventors: Masayuki Kanazawa, Kodaira (JP); Masanori Kudo, Kodaira (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 382 days.

(21) Appl. No.: 10/743,708

(22) Filed: Dec. 24, 2003

(65) Prior Publication Data

US 2004/0137856 A1  Jul. 15, 2004

(30) Foreign Application Priority Data

Dec. 24, 2002  (JP)  ............................. 2002-371767

(51) Int. Cl.
  *H04B 1/02*  (2006.01)
(52) U.S. Cl. ...................................... 455/91; 455/115.1
(58) Field of Classification Search ................. 455/91, 455/115.1, 114.3, 126, 108, 110, 67.13; 330/260, 259, 10, 107, 75, 149; 375/297, 375/296, 296.6; 332/103
See application file for complete search history.

(56) References Cited

U.S. PATENT DOCUMENTS

| | | | | |
|---|---|---|---|---|
| 5,404,378 A | * | 4/1995 | Kimura | 375/296 |
| 5,469,105 A | * | 11/1995 | Sparks | 330/129 |
| 5,802,451 A | * | 9/1998 | Adachi et al. | 455/126 |
| 5,959,499 A | * | 9/1999 | Khan et al. | 330/149 |
| 6,112,062 A | * | 8/2000 | Hans et al. | 455/114.3 |
| 6,240,144 B1 | * | 5/2001 | Ha | 375/297 |
| 6,381,286 B1 | * | 4/2002 | Wilkinson et al. | 375/296 |
| 6,384,677 B1 | * | 5/2002 | Yamamoto | 330/10 |
| 6,693,956 B1 | * | 2/2004 | Yamamoto | 375/219 |
| 6,885,241 B1 | * | 4/2005 | Huang et al. | 330/149 |
| 6,941,118 B1 | * | 9/2005 | Yamamoto | 455/126 |
| 6,985,704 B1 | * | 1/2006 | Yang et al. | 455/126 |
| 6,993,091 B1 | * | 1/2006 | Ratto | 375/297 |

FOREIGN PATENT DOCUMENTS

| | | |
|---|---|---|
| JP | A-5-175743 | 7/1993 |
| JP | 08008876 | 1/1996 |
| JP | 08032614 | 2/1996 |
| JP | 08181717 | 7/1996 |

(Continued)

OTHER PUBLICATIONS

U.S. Appl. No. 09/672,688, filed Sep. 29, 2000, Yamamoto.

(Continued)

*Primary Examiner*—Aung Moe
(74) *Attorney, Agent, or Firm*—Mattingly, Stanger, Malur & Brundidge, P.C.

(57) ABSTRACT

A negative feedback amplifier for a transmitter, in which a vector corrector outputs the corrected signals, an adder adds the feedback signals of the in-phase component and the quadrature component to the in-phase component and the quadrature component of the output of the vector corrector, respectively, a modulator performs a quadrature modulation with respect to the in-phase component and the quadrature component of the outputs from the adder, a power amplifier amplifies the output of the modulator, a demodulator performs a quadrature demodulation to a part of the output of the power amplifier and outputs the feedback signals of the in-phase component and the quadrature component, and the vector corrector performs a correcting operation of canceling an error of at least one of the phases and the amplitudes of the in-phase component and the quadrature component occurring in the demodulator.

12 Claims, 12 Drawing Sheets

FOREIGN PATENT DOCUMENTS

| | | |
|---|---|---|
| JP | 08195770 | 7/1996 |
| JP | 08274777 | 10/1996 |
| JP | 10079742 | 3/1998 |
| JP | 10136048 | 5/1998 |
| JP | A-10-136048 | 5/1998 |
| JP | 2000253037 | 9/2000 |
| JP | 200157578 | 2/2001 |
| JP | 2001057578 A * | 2/2001 |
| JP | 2001136178 | 5/2001 |
| JP | 2001251316 | 9/2001 |
| JP | A-2001-339452 | 12/2001 |
| JP | A-2002-111759 | 4/2002 |

OTHER PUBLICATIONS

"A Digital Cellular Equipment with Linear Modulation", Shimazaki et. Al, Transactions of Spring National Convention Record of IEICE in 1989, B-815.

* cited by examiner

NEGATIVE FEEDBACK AMPLIFIER FOR TRANSMITTER, TRANSMITTER, AND METHOD OF CORRECTING ERROR IN THE NEGATIVE FEEDBACK AMPLIFIER

CROSS-REFERENCE TO RELATED APPLICATION

The present application relates to subject matters described in application Ser. No. 09/672,688 filed on Sep. 29, 2000, now U.S. Pat. No. 6,693,956: and application Ser. No. 09/768,469, filed Jan. 25, 2001, now U.S. Pat. No. 6,384,677 issued on May 7, 2002 both of assigned to the assignee of the present application. The disclosures of both applications incorporated herein by reference.

BACKGROUND OF THE INVENTION

The present invention relates to a negative feedback amplifier of a Cartesian loop system arranged to compensate (or correct) nonlinear distortion of a power amplifier for amplifying an orthogonally modulated signal of a transmitter and a transmitter itself, and more particularly to a method of compensating or correcting a phase error and an amplitude error of a quadrature demodulator to be used for the feedback loop.

The Cartesian loop negative feedback amplifier is an amplifier arranged to realize a negative feedback with signals orthogonal to each other. This amplifier is used as a digital radio communication having adopted a linear modulating system such as a π/4 shift QPSK modulating system or a hexadecimal QAM modulating system, specifically, as a power amplifier for compensating for nonlinear distortion of a transmitter in a narrow band digital ratio communication system. This sort of negative feedback amplifier is arranged to have a quadrature modulator and a quadrature demodulator, the electric performances of which modulator and demodulator, in particular, of the latter is likely to determine the overall performance of the transmitter.

Hence, when designing the negative feedback amplifier, high-precision circuit components have been conventionally used therefor. For example, refer to the thesis: "A Digital Cellular Equipment with Linear Modulation", Shimazaki et. al, Transactions of Spring National Convention Record of IEICE (The Institute of Electronics, Information and Communication Engineers) in 1989, B-815. Later, the prior art will be described with reference to FIGS. 9 and 10.

FIG. 9 is a block diagram for illustrating the conventional negative feedback amplifier. At first, the description will expalin the operation of the negative feedback amplifier. In FIG. 9, an input baseband signal is generated by applying a predetermined digital modulating system to transmission data. Then, the in-phase component of the input baseband signal, that is, the I signal, and the quadrature component thereof, that is, the Q signal are passed through LPFs 4a and 4b, from which the transmission baseband signals Itx and Qtx are applied into adders 5a and 5b. Herein, a PN (Pseudo Noise) generator 90 is served as generating PN code series transmission data. A communication logic circuit 91 is served as converting the transmission data into the corresponding I and Q signals according to the predetermined communication format and modulating system and then outputting the I and Q signals to a D/A (digital-to-analog) converter (not shown).

On the other hand, the feedback baseband signals Id and Qd, which are outputted from a quadrature demodulator 13, are applied into adders 5a and 5b. The adders 5a and 5b operate to subtract the signals Id and Qd from the transmission baseband signals Itx and Qtx, respectively. That is, the adders 5a and 5b performs negative additions. The output signals of the adders 5a and 5b are applied into a quadrature modulator 7, in which the signals are quadrature-modulated with a local signal LO inputted from the other terminal, the local signal LO being outputted from a local oscillating circuit 9.

The quadrature modulator 7 is composed of a 90-degree phase shifter 31a, mixers 32a and 32b, and an adder 33. The 90-degree phase shifter 31a is inputted with the local signal LO (angular frequency: $\omega_0$ and supplies two local signals LOi ($=\cos \omega_o t$) and LOq ($=\sin \omega_o t$) whose phases are shifted by 90 degrees to each other. The mixers 32a and 32b operate to multiply the inputted Im and Qm signals by the local signals LOi and LOq, respectively and then upconvert them. Then, the upconverted signals are added in an adder 33, in which the added signal is made to be an orthgonally modulated signal, that is, a radio signal.

The radio signal, outputted from the quadrature modulator 7, is power-amplified in a power amplifier 8 and then is outputted from an output terminal 11. Ordinarily, the output terminal 11 is connected with an antenna (not shown), from which a radio wave is radiated.

A part of radio wave outputted from the power amplifier 8 is branched in a directional coupler 10. Then, the branched signal is inputted into the quadrature demodulator (also called a quadrature detector) 13. The quadrature demodulator 13 is composed of a 90-degree phase shifter 31b and two mixers 32c and 32d. The 90-degree phase shifter 31b is inputted with the local signal LO inputted from the other terminal, the local signal LO being outputted from the local oscillating circuit 9, and outputs two local signals LOi (=cos $\omega_o t$) and LOq (=sin $\omega_o t$) whose phases are shifted by 90 degrees to each other.

In the quadrature demodulator 13, the mixers 32c and 32d operate to multiply a part of radio wave by the local signals LOi and LOq, respectively. The multiplied signals are made to be the feedback baseband signals Id and Qd. Then, the feedback baseband signals Id and Qd are negatively fed back to the transmitting baseband signals Itx and Qtx in the adders 5a and 5b, respectively. This signal circulation completes the negative feedback loop by which a nonlinear distortion of the power amplifier 8 is compensated.

In turn, the description will explain the influence of phase and amplitude errors onto the transmission performance in the quadrature modulator and the quadrature demodulator. In FIG. 9, if the phases are not balanced with each other in the 90-degree phase shifter 31a and the 90-degree phase shifter 31b, there arises a phase error that the phase difference between the I-component and the Q-component is not just 90 degrees. Further, if the gains of the mixers 32a, 32b, 32c, 32d are not balanced with one another, there arises an amplitude error that the amplitude of the I-component is not matched to that of the Q-component. Herein, assuming that an ideal phase difference (90 degrees) between the two local signals LOi and LOq is as a reference, a phase error is represented by δ. Assuming that the I signal is a reference, an amplitude error of the Q signal is convergence in the I-Q signal space contained in the transmission wave to be shifted from an ideal point of convergence. This shift brings about a degrade of a sensitivity of a receiver having received this transmission wave.

For example, the description will be expanded with an example of a π/4 shift QPSK modulating system. In the I-Q signal space of FIG. 10, eight points indicated by circles represent ideal points of convergence on the I-Q space.

(These eight points are ranged on the circumference of a unit circle at regular intervals of 45 degrees. In the quadrature modulator 7 or the quadrature demodulator 13, a phase unbalance (phase error: δ) is brought about in the 90-degree phase shifter 31a or 31b, thereby making LOq=sin($\omega_o$t+δ). This phenomenon appears on the I-Q space as follows. As shown in FIG. 10, a Q axis that is phase-shifted by 90 degrees from an I axis is rotated by δ so that the Q axis is made to be Qz. FIG. 10 shows an example of δ=10 degrees, at which the eight points of convergence are shifted from circles to triangles. The movement vector at this shift is called a residual vector error, and the effective value about the residual vector error of all points of convergence is called an error vector magnitude (EVM). The ideal points of convergence (circles) are ranged on a round circle, while the actual points of convergence (triangles) caused by the phase error δ are ranged on an inclined ellipse. This results in making the transmission performance (error vector magnitude) degraded. Further, the gains unbalanced among the mixers cause the amplitude error κ between the I signal and the Q signal to be added to the ellipse so that the ellipse is further distorted. This makes the signal more degraded.

In the conventional negative feedback amplifier, it is difficult to easily correct the phase error and the amplitude error. In order to overcome this shortcoming, the use of a highly accurate ring modulator having a wide band characteristic makes it possible to prevent the error vector magnitude from being degraded without correcting the errors.

The technologies about a Cartesian loop negative feedback amplifier have been disclosed in JP-A-2002-111759, JP-A-2001-339452, JP-A-10-136048, and JP-A-5-175743.

However, the foregoing prior arts involve the following shortcomings.

As a first shortcoming, in the case of using a microwave circuit like a ring modulator, it is less disadvantageous in light of reduction of the device in size and cost. In particular, if the radio frequency is low (for example, VHF band or lower), it is difficult to apply the device to a portable phone terminal. Hence, the prior art is required to use an IC (Integrated Circuit) of the commercially available quadrature modulator and demodulator though they are not so high in accuracy. It means that the error vector magnitude (EVM) of the transmitter depends on the electric performance of the commercially available IC. In order to improve the error vector magnitude, it is necessary to use an expensive highly accurate IC in place of the commercially available IC. Further, if such a highly accurate IC is not commercially available, it is necessary to newly develop a new IC dedicate therefor.

As a second shortcoming, even in the case of using the ring modulator or the IC for the modulator or the demodulator of the communication apparatus, it is not possible to compensate errors further degraded by some factors (aging, temperature change and so forth) after the product of the communication apparatus is delivered to the user from the factory. It means that the communication apparatus is required to perform periodic maintenance operations for correcting errors (for example, returning the product to the factory and compensating the errors at the factory).

SUMMARY OF THE INVENTION

It is a main object of the present invention to provide a method of detecting and correcting errors of the negative feedback amplifier so that the error vector magnitude may be improved even in the negative feedback amplifier having adopted the commercially available IC, in particular, a method of detecting and correcting errors of the quadrature demodulator that is a main cause of the adverse effect on the error vector magnitude.

It is a second object of the present invention to automate a series of adjusting operations concerning correction of errors of the negative feedback amplifier.

It is a third object of the present invention to eliminate the necessity of the maintenance operation having been conventionally executed even after the communication apparatus is delivered to the user from the factory.

According to an aspect of the invention, the negative feedback amplifier included in the transmitter comprises a vector corrector for correcting at least one of a phase and an amplitude of an in-phase component and a quadrature component of an input baseband signal containing data to be transmitted, adders for adding feedback signals of the in-phase component and the quadrature component to the in-phase component and the quadrature component of an output of the vector corrector, respectively, a modulator for orthogonally modulating the in-phase components and the quadrature components of the outputs of the adders, a power amplifier for amplifying an output of the modulator, a demodulator for orthogonally demodulating a part of the output of the power amplifier and outputting the feedback signals of the in-phase component and the quadrature component, and the vector corrector serving to perform a correcting operation of canceling an error of at least one of the phase and the amplitude of the in-phase component and the quadrature component in the demodulator.

Other objects, features and advantages of the invention will become apparent from the following description of the embodiments of the invention taken in conjunction with the accompanying drawings.

DESCRIPTION OF THE EMBODIMENTS

Figure 1A:
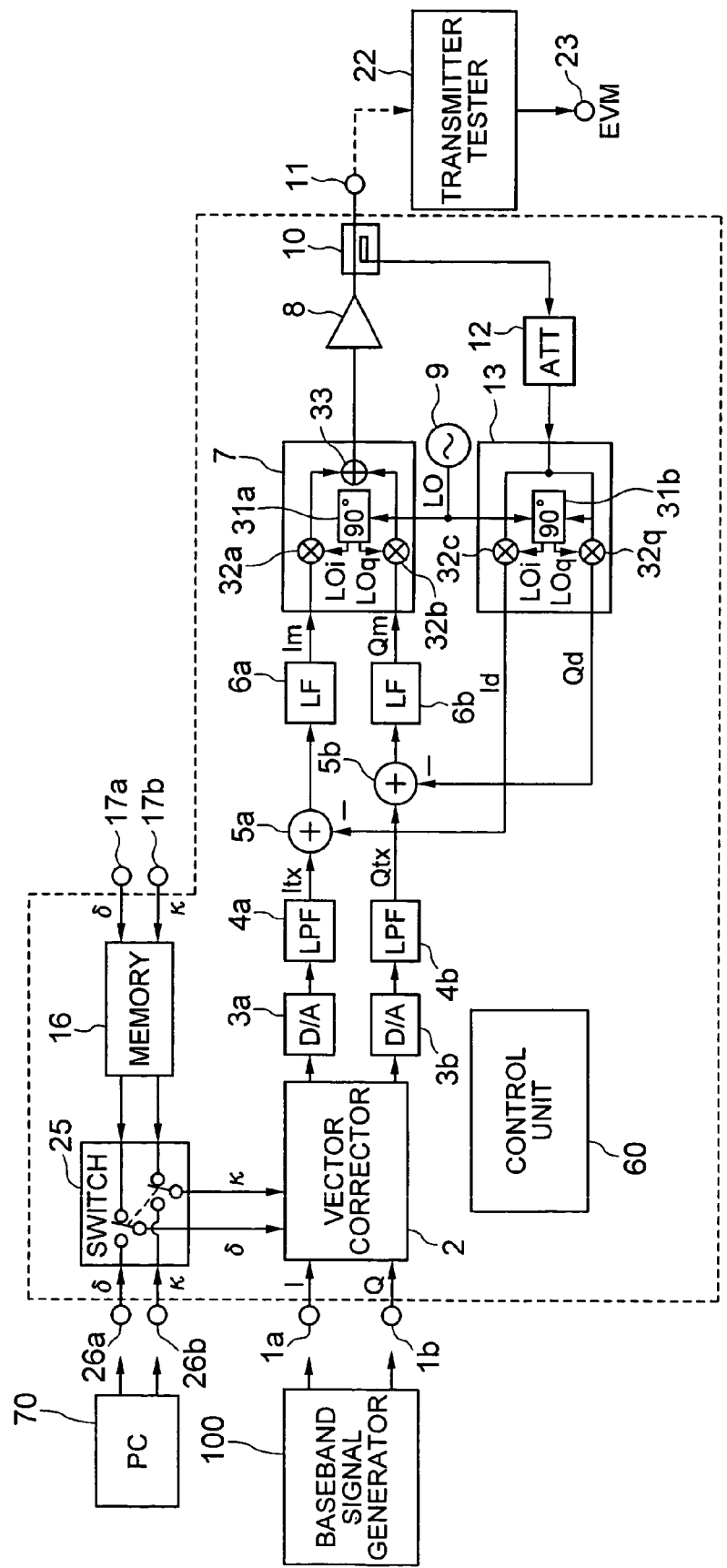
FIG. 1A is a block diagram for explaining a method of correcting a negative feedback amplifier according to a first embodiment of the present invention.

Hereafter, the negative feedback amplifier and the method of correcting an error thereof according to the present invention will be described in more detail along the embodiments of the present invention. In FIGS. 1A, 1B, 3, and 7, the same reference numbers indicate the same parts or the parts having the same function.

The first embodiment of the present invention will be described with reference to FIGS. 1 and 2. FIG. 1 is a block diagram showing a transmitter to which the present invention is applied. The portion enclosed in a dotted line of FIG. 1 indicates a transmitting unit including a Cartesian loop negative feedback amplifier for performing an error correcting process according to the present invention. In this embodiment, a general-purpose quadrature demodulator 13 (for example, a commercially available demodulator IC) is used, and the method of correction in the demodulator 13 is disclosed.

The I signal and the Q signal of the baseband signal containing voice data or the other information are generated in a baseband signal generator 100. The digital input baseband I signal and the digital input baseband Q signal are inputted at input terminals 1a and 1b of a vector corrector 2. The vector corrector 2 performs a vector correcting process with respect to these digital signals. Concretely, the vector correcting process is executed to cancel both of the phase error $\delta$ and the amplitude error $\kappa$ of the quadrature demodulator 13, that is, the errors ($\delta$, $\kappa$). The operation of the vector corrector 2 will be discussed later.

The corrected I and Q signals are inputted into D/A (digital-to-analog) converters 3a and 3b, respectively. In the D/A converters 3a and 3b, these signals are converted into the corresponding analog signals. The analog signals are further inputted into LPFs (Low-path Filter) 4a and 4b, respectively. In these LPFs, unnecessary frequency components are removed from the analog signals. The resulting signals are made to be the transmission baseband signals Itx and Qtx, which are applied into adders 5a and 5b.

The adders 5a and 5b are inputted with feedback baseband signals Id and Qd outputted from a quadrature demodulator 13 and perform negative additions of the feedback baseband signal Id and the transmission baseband signals Itx and of the feedback baseband signal Qd and the transmission baseband signal Qtx, respectively. The added signals are band-limited by loop filters 6a and 6b, respectively. The band-limited signals are inputted into a quadrature modulator 7. In the quadrature modulator 7, the band-limited signals are orthogonally modulated with a local signal LO inputted from the other terminal, the local signal LO being outputted from a local oscillating circuit 9. After being modulated, the signal is outputted as a radio signal.

The quadrature modulator 7 is composed of a 90-degree phase shifter 31a, mixers 32a and 32b, and an adder 33. The 90-degree phase shifter 31a is inputted with the local signal LO (angular frequency: $\omega_o$) sent from the local oscillating circuit 9 and then outputs two local signals LOi (=cos $\omega_o t$) and LOq (=sin $\omega_o t$) whose phases are varied by 90 degrees. The mixers 32a and 32b multiply the input Im signal by the local signal LOi and the input Qm signal by the local signal LOq, respectively. The multiplied signals are upconverted and then added in the adder 32. The added signal is outputted as a radio signal.

The radio signal, which is outputted from the quadrature modulator 7, is power-amplified by a power amplifier 8. Then, the amplified signal is outputted at an output terminal 11. A part of the radio signal outputted from the power amplifier 8 is branched in a directional coupler 10. Then, the branched signal is attenuated to a predetermined feedback level by an attenuator 12. The attenuated signal is inputted into the quadrature demodulator 13. In transmitting the radio signal, an antenna (not shown) is connected with an output terminal 11.

The quadrature demodulator 13 is composed of a 90-degree phase shifter 31b and mixers 32c and 32d. The 90-degree phase shifter 31b is inputted with the local signal LO inputted from the other terminal, the local signal LO being outputted from the local oscillating circuit 9, and outputs the two local signals LOi (=cos $\omega_o t$) and LOq (=sin $\omega_o t$) whose phases are varied by 90 degrees.

In the quadrature demodulator 13, a part of the radio signal is inputted into the mixers 32c and 32d, in which these signals are multiplied by the local signals LOi and LOq, respectively. The multiplied signals are made to be the feedback baseband signals Id and Qd. These signals Id and Qd are supplied to the adders 5a and 5b. These feedback baseband signals Id and Qd are negatively fed back to the transmission baseband signals Itx and Qtx in the adders 5a and 5b. The aforementioned feedback completes a negative feedback loop by which the nonlinear distortion of the power amplifier 8 is compensated.

A control unit 60 is composed of a processor (for example, DSP), which controls the operation timing of the overall transmitter and each portion thereof and manages the operation of an error correcting unit composed of a vector corrector 2, a switcher 25 and a memory 16 included in the Cartesian negative feedback amplifier.

In order to detect and adjust an error of the quadrature demodulator 13, in manufacturing and adjusting the transmitter in a factory, the operator connects a transmitter tester 22 to the output terminal 11 so that the test I and Q signals prescribed by the transmitter tester 22 into the input terminals 1a and 1b for the purpose of monitoring an EVM (Error Vector Magnitude) outputted from the transmitter tester 22. The transmitter tester 22 is a measuring apparatus dedicated for analyzing the EVM (unit: %) of the inputted transmission wave and then outputting the analyzed result. The EVM indicates how much the transmitting signal is distorted from the ideal signal with no error. If the transmitting signal is ideal with no distortion, the EVM becomes zero (%).

Further, the operator connects a terminal device 70 such as a personal computer to input terminals 26a and 26b so that the operator may enter an initial value to the vector corrector 2 with an input device such as a keyboard of the computer. The initial value is formal set data like $\delta=0$ and $\kappa=1$. The data is inputted into the vector corrector 2 through the switch 25, in which corrector the correction is specified.

Figure 10:
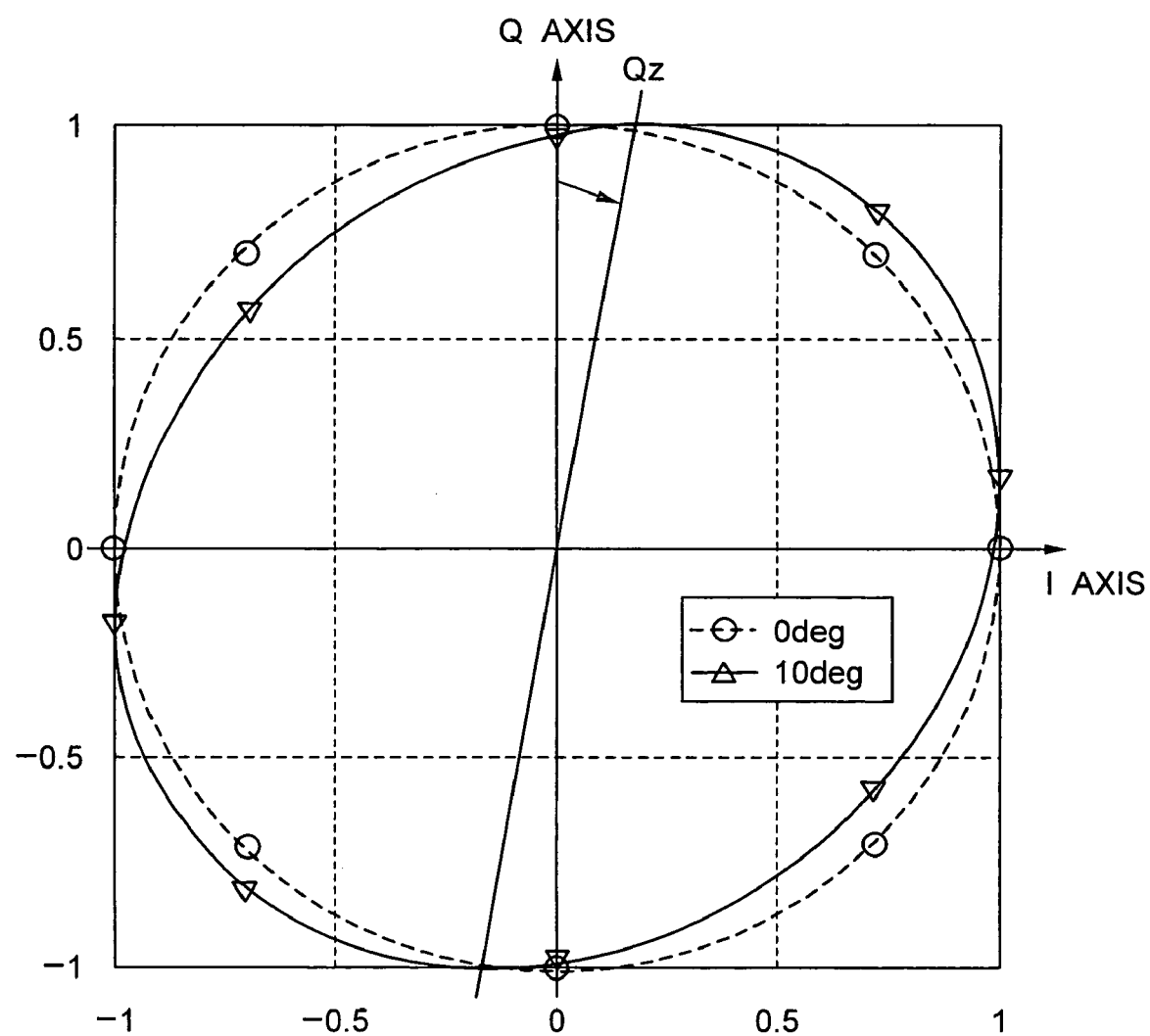
FIG. 10 is a view for explaining a distortion of a signal point caused by an error of the quadrature demodulator.

Then, the operator handles the keyboard of the terminal device as monitoring the EVM value. The operator checks a change of the EVM value as increasing or decreasing the values of $\delta$ and $\kappa$ with the initial value as the center value and searches the value that reduces the EVM value to a minimum by trial and error. In the ideal state, the EVM value is 0%. Further, in the embodiment shown in FIG. 10, the points of convergence indicated by triangles are shifted to the ideal points of convergence indicated by circles, so that the trace of the points of convergence is changed from an ellipse to a unit circle.

By monitoring the EVM value through the tester 22, when the values of $\delta$ and $\kappa$ that reduce the EVM to a minimum are determined, the determined values of $\delta$ and $\kappa$ are stored in a memory 16 through terminals 17a and 17b. Then, the error correcting work in the factory is finished.

The foregoing description has been expanded along the operator's manual correcting work. In place, the transmitter tester 22 is connected with the device such as a personal computer through an external interface like a GPIB (General Purpose Interface Bus) so that the automatic adjustment may be made possible.

Figure 1B:
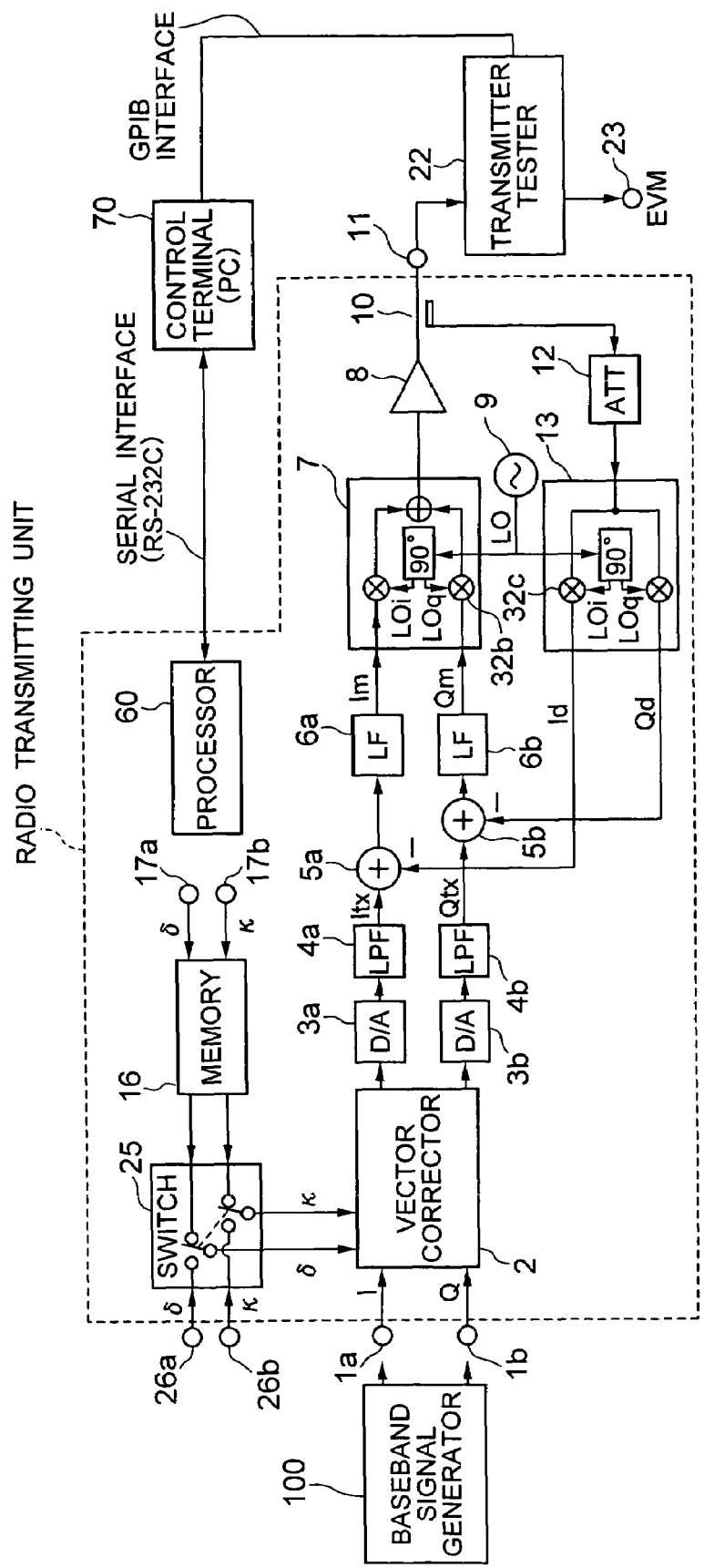
FIG. 1B is a block diagram showing a transformation of the negative feedback amplifier shown in FIG. 1A in which the error correction is automatically made.

FIG. 1B is a block diagram showing an exemplary arrangement of the transmitter provided with a negative feedback amplifier for automatically correcting amplitude and phase errors.

In FIG. 1B, the same reference numbers as those shown in FIG. 1A indicate the same elements or the elements having the same functions, respectively. The elements that have been already described with reference to FIG. 1A are not described herein. An external control terminal 70 such as a personal computer is connected with the transmitter tester 22 through the GPIB. The control terminal is connected with the control unit 60 through a serial interface such as RS232C. The control terminal 70 includes a control program having operation commands of the transmitter tester 22 and another control program having commands for specifying an operation of the control unit 60, both control programs being incorporated therein. The control terminal 70 causes the transmitter tester 22 and the control unit 60 to operate according to the sequence program having the same procedure as the manual adjusting work having been described with reference to the preceding FIG. 1. According to this sequence program, the control terminal 70 reads the EVM value being measured by the transmitter tester 22 as increasing or decreasing the set values of δ and κ to be given to the vector corrector 2, determines the values of δ and κ at which the EVM value is reduced to a minimum, and put the determined values of δ and κ into the memory 16.

When the transmitter is operating in field use, the operation is executed to read the values stored in the memory 16 when the power is on, enter the values into the vector corrector 2 through the switcher 25, specify the correction, and then perform a vector correcting process of canceling the errors of the input I and Q signals occurring in the quadrature demodulator 13. Then, the corrected I and Q signals are inputted into the negative feedback amplifier. The foregoing correcting method allows the errors occurring in the quadrature demodulator 13 to be corrected when the transmitter is operating in field use.

Figure 2:
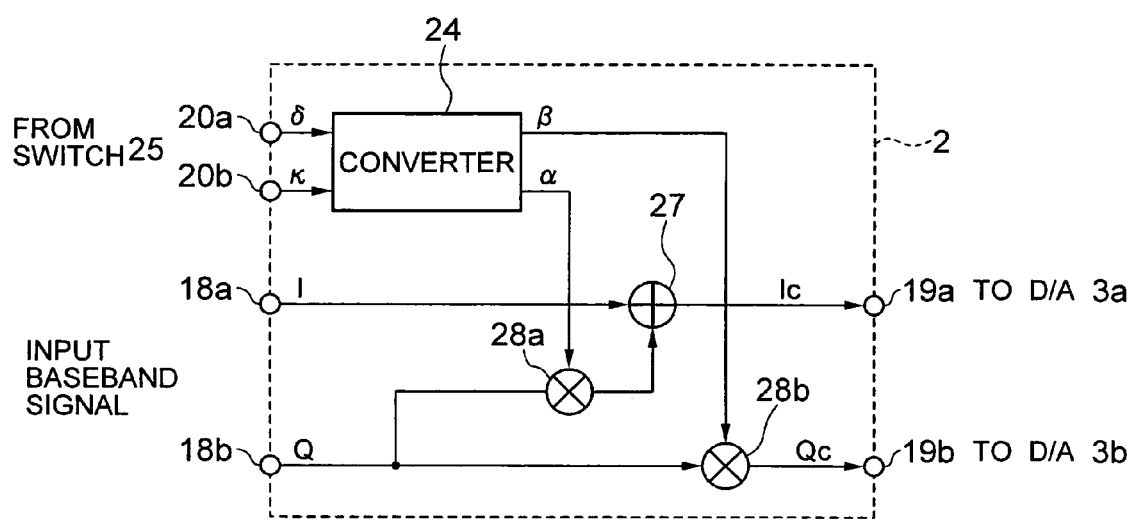
FIG. 2 is a block diagram for explaining a vector corrector.

Next, the arrangement of the vector corrector 2 is shown in FIG. 2. The vector corrector 2 is arranged to output Ic and Qc. The values of Ic and Qc are derived by operating the variables α and β represented as a function of δ and κ with respect to the input signals I and Q according to the following expressions (1) and (2).

$$Ic = I + \alpha Q \quad (1)$$

$$Qc = \beta Q \quad (2)$$

wherein $$\alpha = -\tan \delta \quad (3)$$

$$\beta = 1/(\kappa \cos \delta) \quad (4)$$

The converter 24 performs the operations of the expressions (3) and (4). The adder 27 and the multipliers 28a and 28b perform vector operations of the expressions (1) and (2). The converter 24 may be easily realized by a digital signal processor (DSP) or a ROM table for pre-storing the converted values in a ROM.

As mentioned above, by performing the vector operations of the expressions (1) and (2) so as to cancel the errors (d, k) of the quadrature demodulator 13 with respect to the input I and Q signals in advance, the errors occurring in the quadrature demodulator 13 is eliminated.

This embodiment makes it possible to use the commercially available general-purpose IC for the quadrature demodulator. Hence, the embodiment allows the phase error and the amplitude error to be corrected in the feedback amplifier that does not need to use high-precision microwave circuit components.

Figure 3:
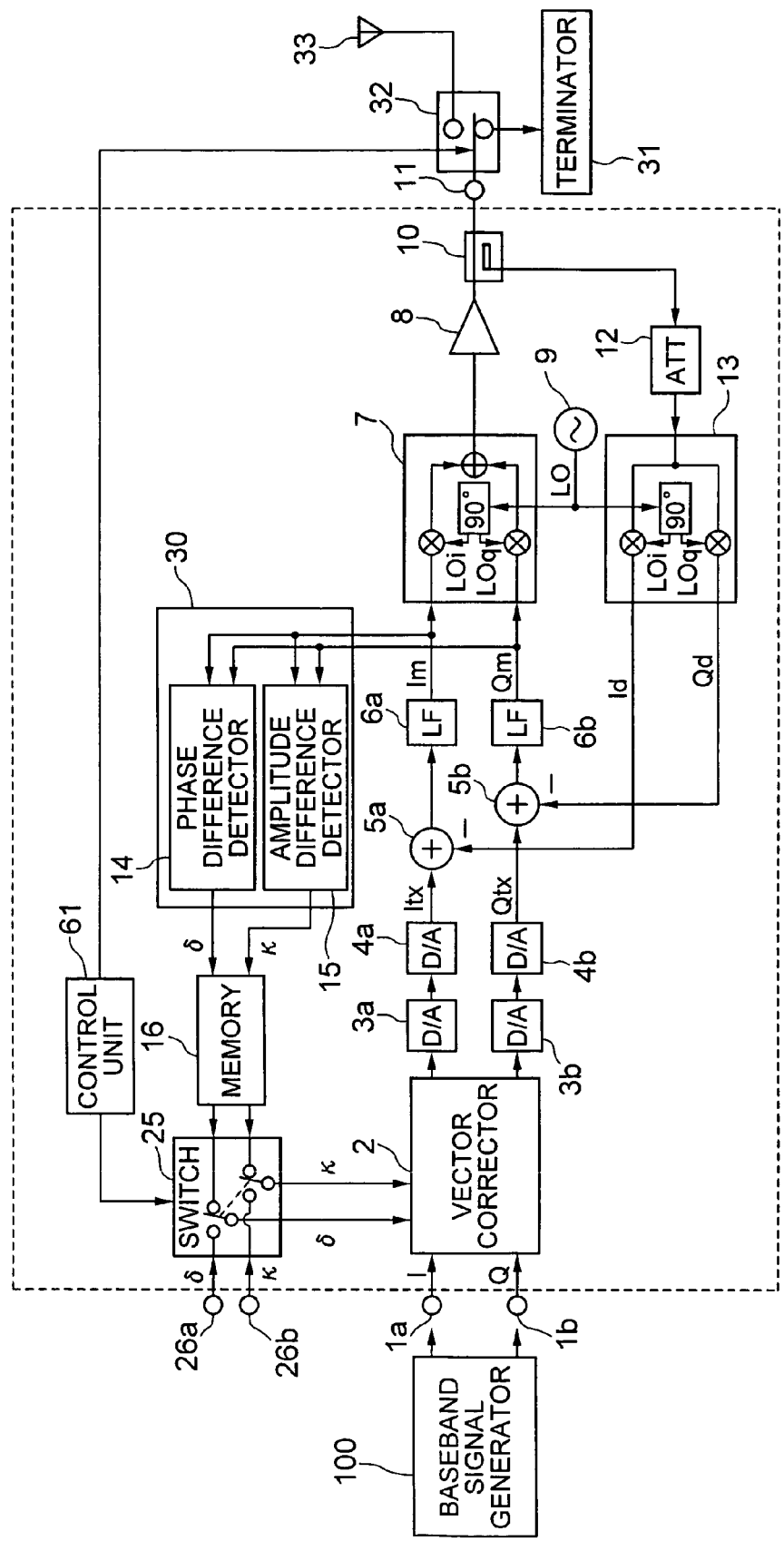
FIG. 3 is a block diagram showing a negative feedback amplifier for explaining a second embodiment of the present invention.

In turn, the second embodiment of the invention arranged to detect the phase error and the amplitude error with an error detector will be described with reference to FIGS. 3 and 4. FIG. 3 shows a transmitter having a Cartesian loop negative feedback amplifier to be used for executing the correcting method of the quadrature demodulator with no transmitter tester. The arrangement and the operation of the essential portion of the transmitter are likewise to those shown in FIGS. 1A and 1B. In this embodiment, however, an error detector 30 is newly provided. The error detector 30 includes a phase difference detector 14 and an amplitude difference detector 15.

In FIG. 3, for detecting and adjusting the errors (d, k) of the quadrature demodulator 13 in a factory or before shipment of the product, a terminator 31 is connected with an output terminal 11 through a switch 32. In succession, the testing I and Q signals are inputted into the input terminals 1a and 1b, respectively. Further, the I and Q signals Im and Qm to be inputted to the quadrature modulator 7 are applied into the error detector 30. In the transmission operation, the output terminal 11 is connected with an antenna 33.

When starting the adjustment, under the control of the control unit 60, the vector corrector 2 is inputted with the initial values (for example, δ=0, κ=1) from the input terminals 26a and 26b through the switcher 25 so that the initial values is set to the corrector 2. The phase difference detector 14 of the error detector 30 detects the phase error δ between the input Im and Qm signals and outputs δ information. The amplitude difference detector 15 detects the amplitude error κ between the input Im and Qm signals and outputs κ information. After the detector, the δ and κ informations are stored in the memory 16. Then, the adjusting work is finished.

When the transmitter is operated in field use after the transmitter is passed to the user, the values having stored in the memory 16 when the power is on are read out of the memory 16 and then inputted into the vector corrector 2 through the switcher 25. The values are specified in the vector corrector. Based on these values, the vector correcting process is executed of canceling the errors occurring in the quadrature demodulator 13 with respect to the input I and Q signals and then the corrected I and Q signals are inputted into the negative feedback amplifier.

The control unit 61 includes a processor (for example, DSP). The processor is served to control the operation timing of the overall transmitter and each element of the transmitter and to manage the operation of the error correcting unit including a vector corrector 2, a switcher 25, a memory 16, and an error detector 30 included in the Cartesian negative feedback amplifier.

Then, the operation of the error detector 30 will be described with reference to FIG. 4. As the testing I and Q signals to be used for adjustment are used the tone signals (angular frequency: $\omega_a$, period $T=2\pi/\omega_a$) whose phases are varied by 90 degrees with respect to each other (orthogonal relation). The tone signals are represented by the following expressions.

$$I(t)=\cos(\omega_a \cdot t) \quad (5)$$

$$Q(t)=\sin(\omega_a \cdot t) \quad (6)$$

For simplifying the description, no vector correction is executed in the vector corrector 2 (that is, the values of δ=0 and κ=1 are specified). Hence, the phase difference and the amplitude difference are kept as those of the original signal.

Figure 4:
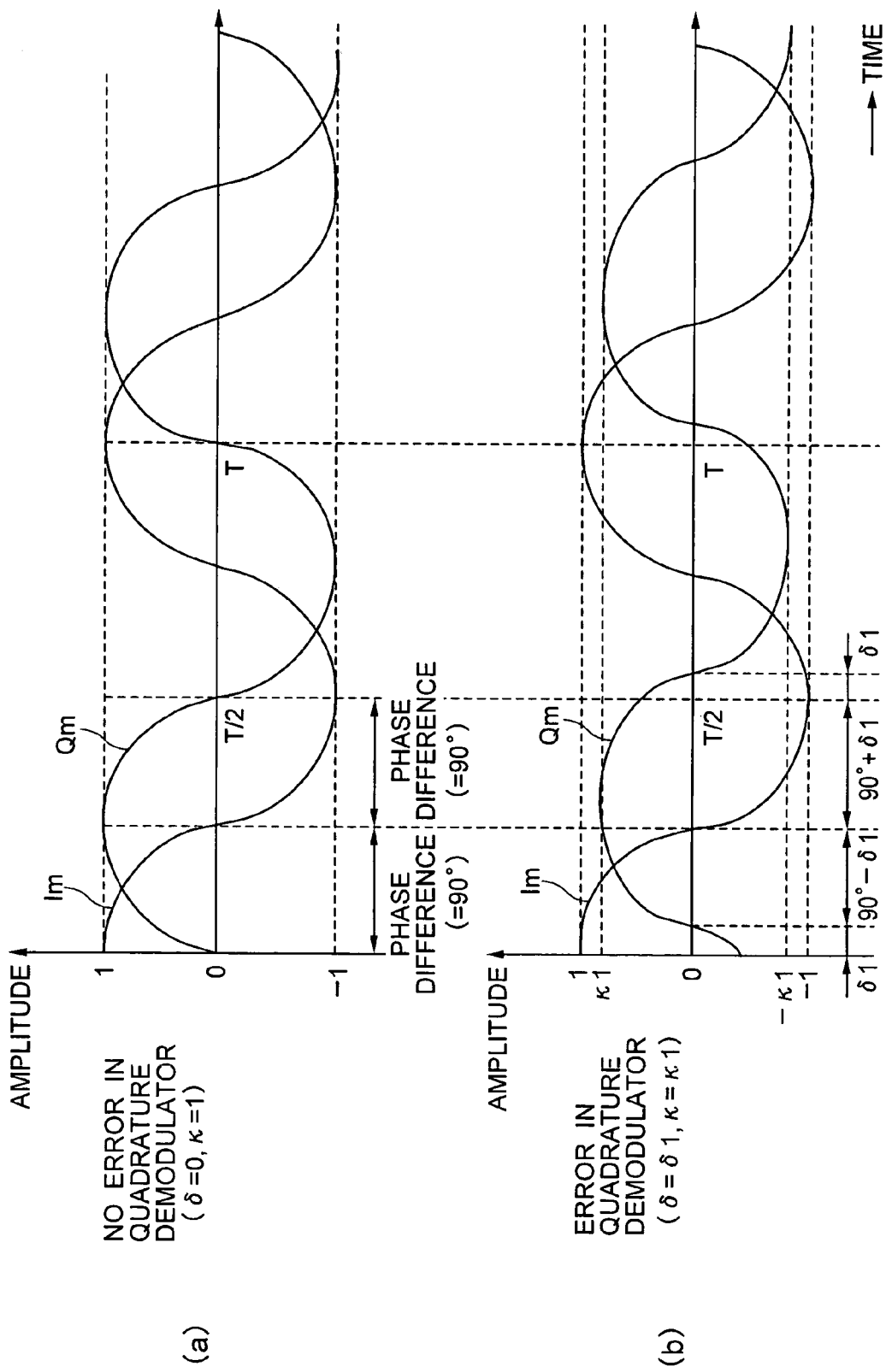
FIG. 4 is a chart showing a signal waveform for explaining an operation of an error detector.

In FIG. 4, (a) shows the comparison of the waveform between the Im signal and the Qm signal in the case that no error occurs in the quadrature demodulator 13 (δ=0, κ=1). The Im signal and the Qm signal are made to be the same tone waveforms as the input testing signals indicated by the expressions (5) and (65). The phase difference detector 14 compares the phases of the two signals Im and Qm with each other, detects the phase error δ (in this case, δ=0) as the basis of normal value of 90 degrees, and outputs the information of δ=0. Further, the amplitude difference detector 15 compares the maximum amplitudes of the two signals Im and Qm with each other, detects the amplitude ratio κ (in this case, κ=1) of the Q signal as the basis of the I signal, and then outputs the information of κ=1.

Next, in FIG. 4, (b) shows the comparison of the waveform between the Im and the Qm signals provided in the case that the amplitude error and the phase error occur in the quadrature demodulator 13 (δ=δ1, κ=κ1). The errors (δ1, κ1) of the quadrature demodulator 13 causes the Qm signal to be phase-shifted by δ1 and to be changed in amplitude by κ1 with respect to the Qm signal.

The phase difference detector 14 compares the phases of the two signals Im and Qm with each other, detects the phase error δ (in this case, δ1) as the basis of 90 degrees, and outputs the information of δ=δ1. Further, the amplitude difference detector 15 compares the maximum amplitudes of two signals Im and Qm with each other, detects an amplitude ratio κ (in this case, κ1) of the Q signal as the basis of the I signal, and outputs the information of κ=κ1.

Figure 5:
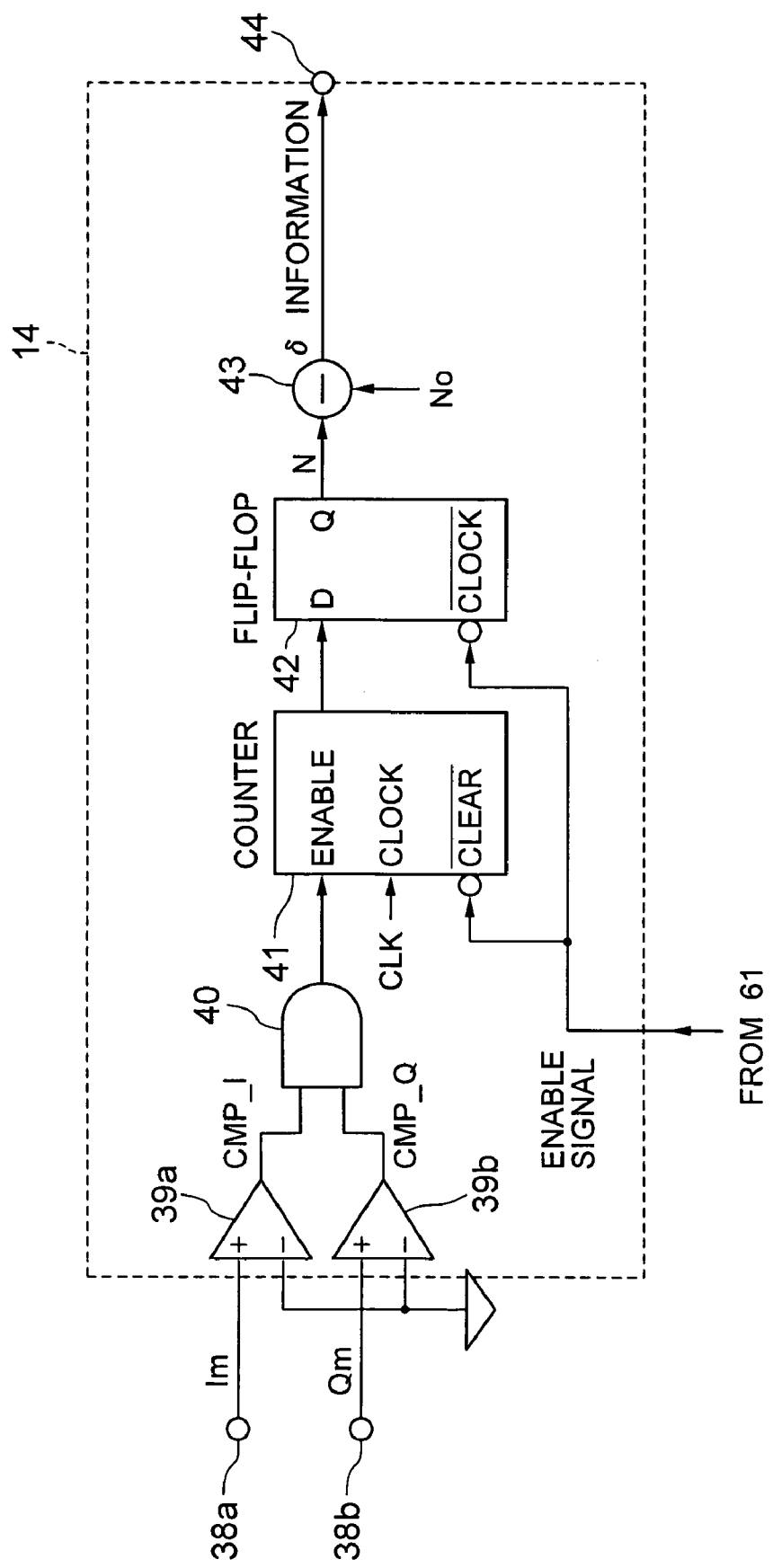
FIG. 5 is a block diagram for explaining an example of a phase difference detector included in the error detector.
Figure 6:
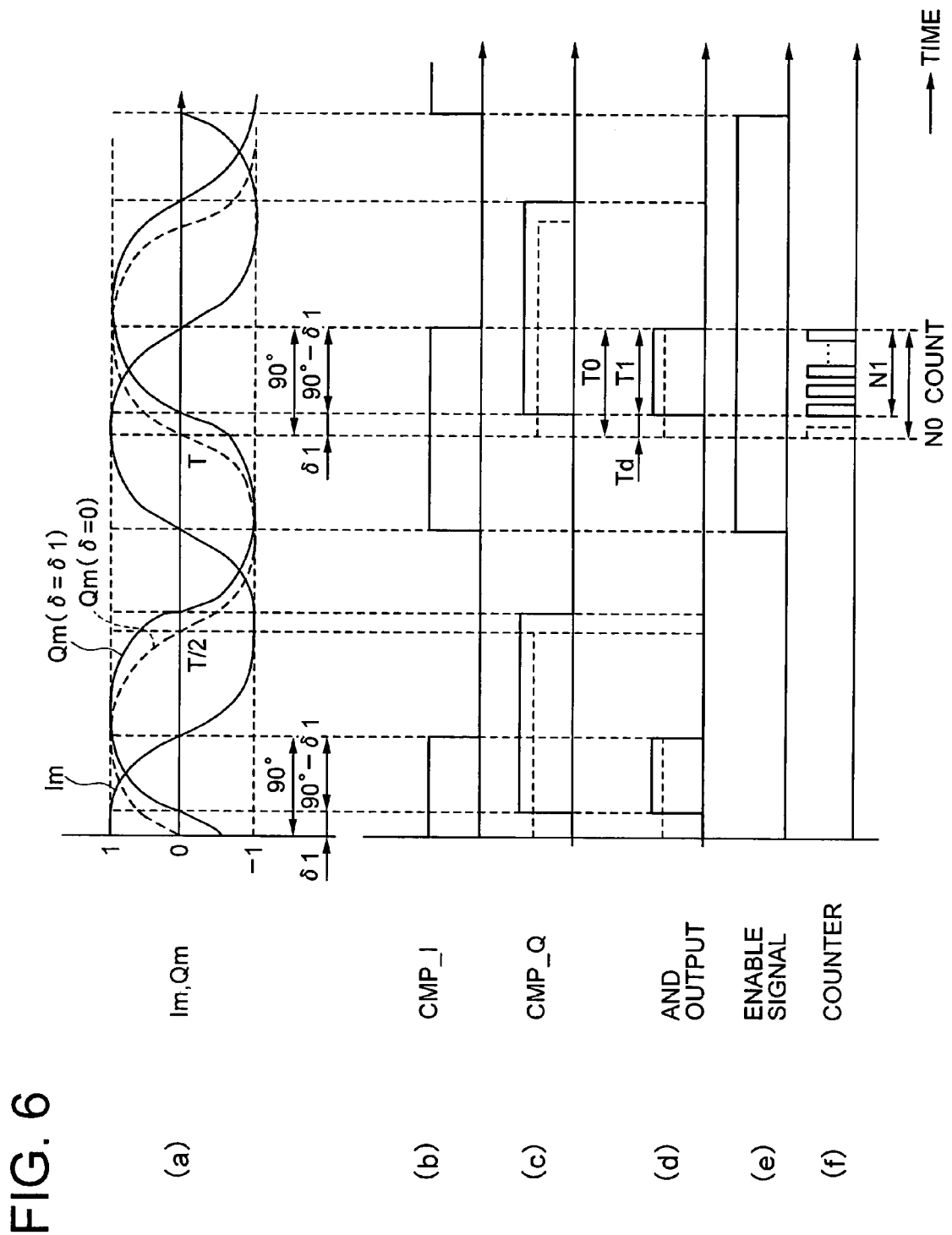
FIG. 6 is a chart showing a signal waveform for explaining an operation of a phase difference detector.

FIG. 5 shows an exemplary circuit arrangement of the phase difference detector 14. FIG. 6 is a waveform chart showing the operation of the detector 14. The phase difference detector 14 includes comparators 39a, 39b, an AND gate 40, a counter 41, a flip-flop 42, and a subtractor 43.

In FIG. 6, (a) shows the Im and Qm signal waveforms inputted to the phase difference detector 14 in a case that the tone signals orthogonal to each other, indicated in the expressions (5) and (6), are used as the testing I and Q signals. For simplifying the description, in FIG. 6A, the amplitude error (κ=1) is ignored and only the phase error δ is considered. The Im and Qm signals with the phase error δ (δ=δ1) is indicated in real line, while the Qm signal with no phase error (δ=0) is indicated in broken line.

The comparators 39a and 39b are inputted with the Im signal and the Qm signal, respectively. Each comparator compares each signal with a mid-point potential, converts a COMP_I signal or a COMP_Q signal on the logical level (Hi or Low), and outputs the signal (see (b) and (c) in FIG. 6). The AND gate 40 takes a logical AND of both of the CMP_I signal and the CMP_Q signal (see (d) in FIG. 6).

The counter 41 is inputted with an output waveform (see (d) in FIG. 6) of the AND gate 40 at an enable input terminal and with an enable signal (for example, a waveform in which one interval of the tone signal is High as shown in (e) of FIG. 6) at a clear input terminal, both of the waveforms being sent from the control unit 61. The counter 41 counts an interval when the enable signal is High and the output of the AND gate 40 is High (T1 interval of (d) in FIG. 6) by clocks. The output signal of the counter 41 is inputted into the flip-flop 42 in which the output signal is latched at the rise of the enable signal (see (e) of FIG. 6) inputted at the other clock input terminal of the flip-flop 42. The counter value N latched by the flip-flop 42 is further inputted to the subtractor 43. In the subtractor 43, the counter value N0 (that is a count value corresponding to a phase difference of 90 degrees) is subtracted from the counter value N (see (f) in FIG. 6).

In FIG. 6, if no phase error δ (δ=0) occurs between the Im and the Qm signals, the phase difference between both of the signals corresponds to 90 degrees. In this phase difference, the High interval in the output of the AND gate 40 is T0 and the count value outputted from the flip-flop 42 is N0, the output of the subtractor 43 becomes zero.

In a case that the phase error δ=δ1 occurs between the Im and the Qm signals, the High interval in the output of the AND gate is changed into T1 by Td time corresponding to δ1 and the count value outputted from the flip-flop 42 becomes N1. Hence, the output of the subtractor 43 is made to be N0−N1. For example, assuming that the I and the Q tone signals take a frequency of 1 kHz and the clock frequency is 360 kHz, since one count of the counter 41 corresponds to a phase of one degree (360 clock counts correspond to one period, that is, 360 degrees), with N0=90, the output value (N0−N1) of the subtractor 43 signifies that one resolution corresponds to the phase error δ1.

Figure 7:
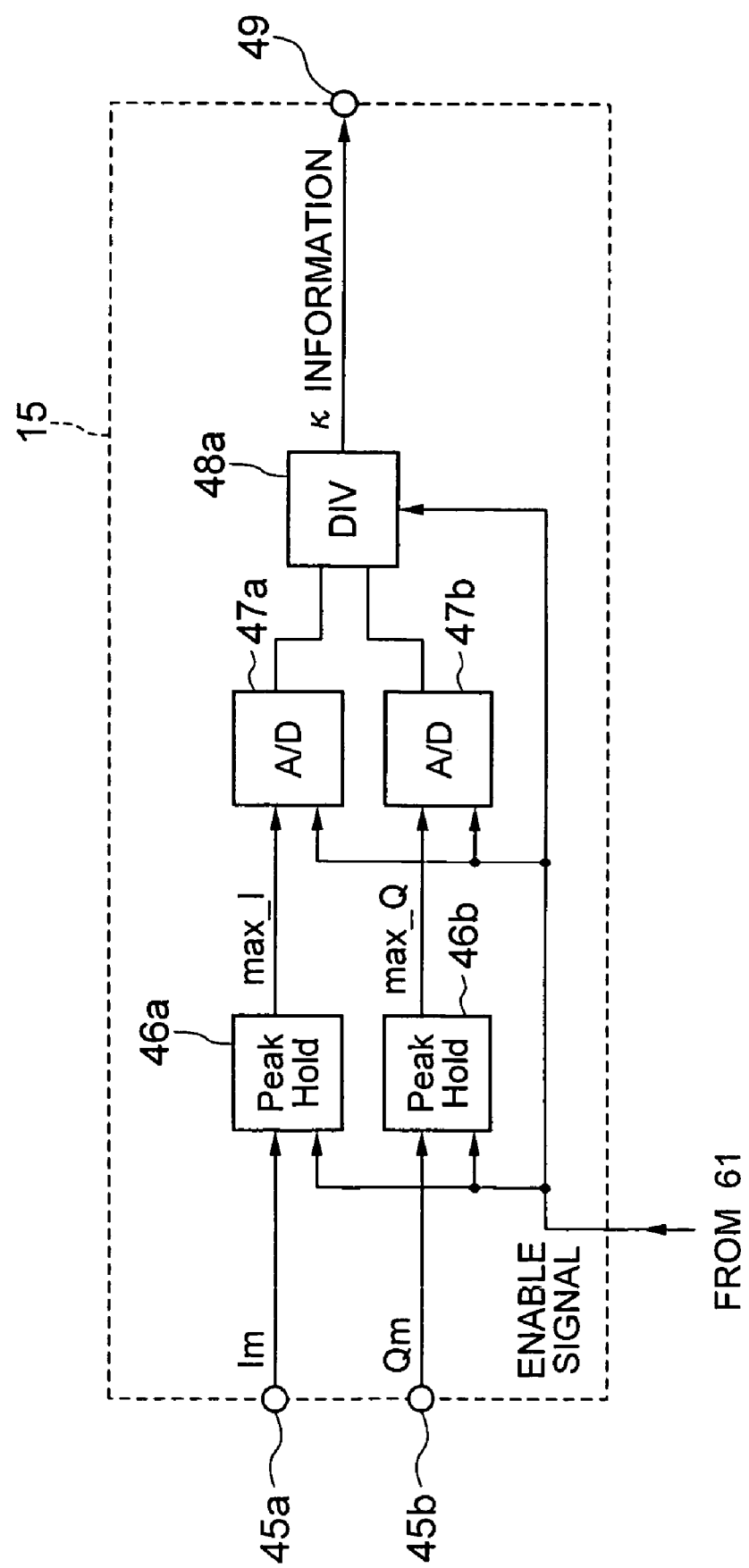
FIG. 7 is a block diagram for explaining an example of an amplitude difference detector included in the error detector.
Figure 11:
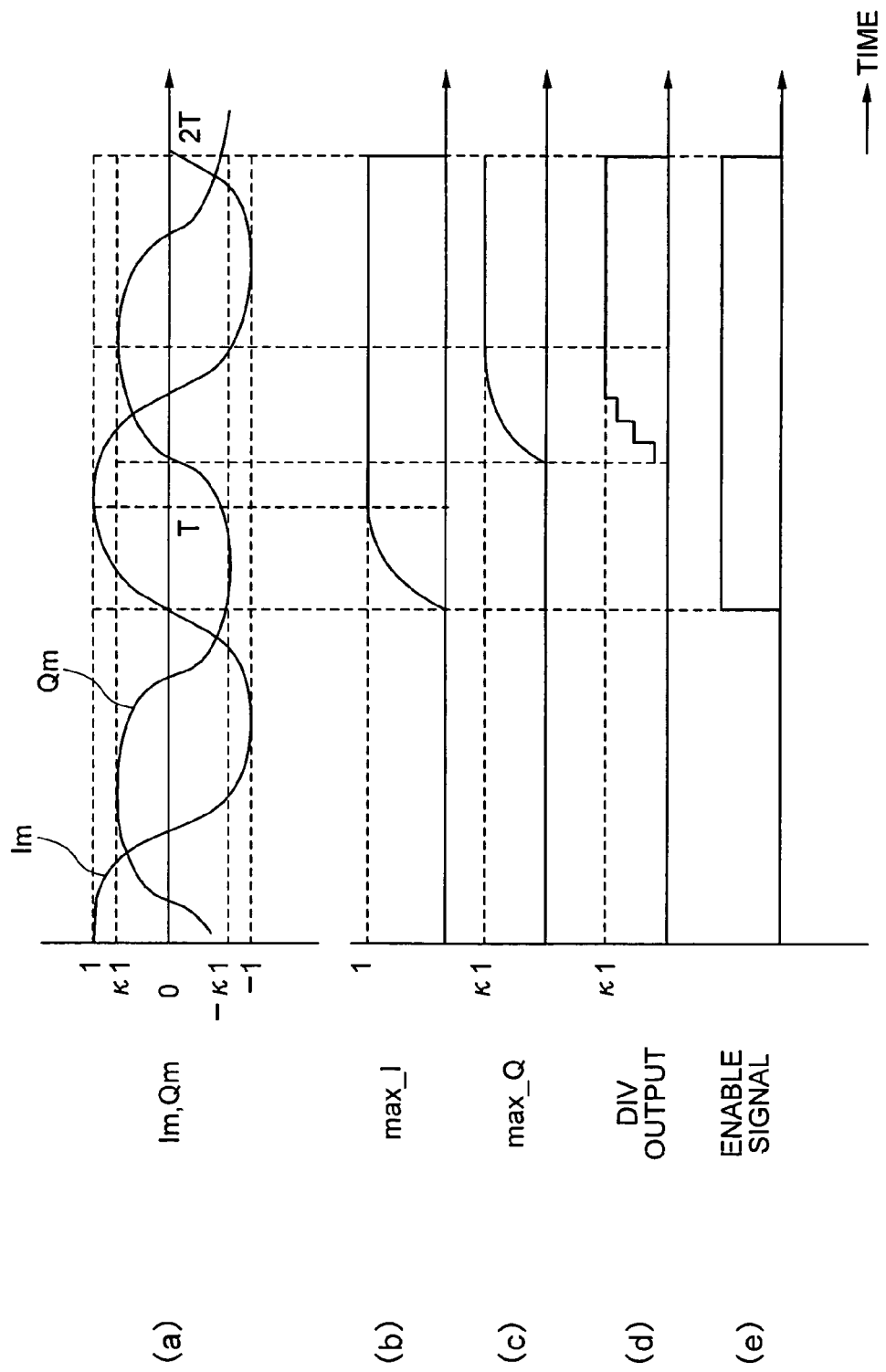
FIG. 11 is a signal waveform chart for explaining an operation of an amplitude error detector.

Then, an exemplary circuit arrangement of the amplitude difference detector 15 is shown in FIG. 7. FIG. 11 shows the waveform in the operation of the detector 15. The amplitude difference detector 15 is composed of peak-hold circuits 46a, 46b, A/D converters 47a, 47b, and a divider 48.

The description will explain the case that the orthogonal tone signals indicated in the foregoing-expressions (5) and (6) are used as the testing I and Q signals. Further, the amplitude error detector 15 is inputted with, for example, an enable signal (e) shown in FIG. 11 sent from the control unit 61. The enable signal (e) is a signal in which the interval corresponding to one period is High. When the Im and the Qm signals as shown by (b) in FIG. 4 are inputted into the amplitude difference detector 15, in the interval where the enable signal is High, the peak-hold circuits (PH) 46a and 46b detect their peak voltages max_I (in this case, 1) and max_Q (in this case, κ1), and hold the voltages. The detected peak voltages are inputted into the A/D converter 47 in which these voltages are converted into the digital data. Then, the divider (DIV) 48 performs an operation of deriving an amplitude ratio (max_Q/max_I) and then outputs the data corresponding to the amplitude error κ (in this case, κ=κ1). The output of the divider 48a appearing immediately before the enable signal (e) changes its state from High to Low is the final determinant value of the amplitude error information κ.

As set forth above, this embodiment makes it possible to correct the errors without having to use a measuring device dedicated for measuring the EVM such as the transmitter tester, thereby allowing a series of adjusting operations to be automated.

In turn, the description will explain the third embodiment of the present invention will be described with reference to FIGS. 3 and 8. In the third embodiment, the overall error detection and correction is automated and the maintenance-free error correction after shipping from a factory is realized. In FIG. 3, when adjusting the transmitter in the factory, the quadrature demodulator 13 is corrected by the same method as the foregoing second embodiment.

When adjusting the transmitter in the factory, the vector corrector 2 is inputted with the initial values (for example, δ=0, κ=1) at the input terminals 26*a* and 26*b* through the switcher 25, and then resets itself to these values. In the state that the output terminal 11 is ended with the terminator or the like, the testing I and Q signals are inputted into the input terminals 1*a* and 1*b*, and the I and the Q signals Im and Qm to be inputted to the quadrature modulator 7 are inputted into the error detector 30. Then, the phase difference detector 14 detects a phase error δ between the Im and the Qm signals. The amplitude difference detector 15 detects an amplitude error κ between the Im and the Qm signals. The information about the detected δ and κ is saved in the memory 16, and then the adjusting work is finished.

When the transmitter is operating in field use, the values having been stored in the memory 16 when the power is turned on are read out of the memory 16 and then are inputted into the vector corrector 2 through the switch 25. Those values are set as the correcting values of the vector corrector 2. Based on the correcting values, the vector corrector 2 performs a vector correcting process of canceling the errors of the quadrature demodulator 13. The vector-corrected I and Q signals are inputted into the negative feedback amplifier.

Next, the error correction is carried out as the performance of the quadrature demodulator 13 is changing due to the aging and the temperature change. For the correction are used the training timing in the frames of the data to be transmitted and the timing of the known fixed patterns. In these training timing or the timing of the known fixed patterns, the errors (δ, κ) between the Im and the Qm signals are periodically detected and the content of the memory 16 is updated. At a time, the correction of the vector corrector 2 is reset. These operations allow the maintenance-free error correction to be realized after shipping the transmitter from the factory.

Figure 8:
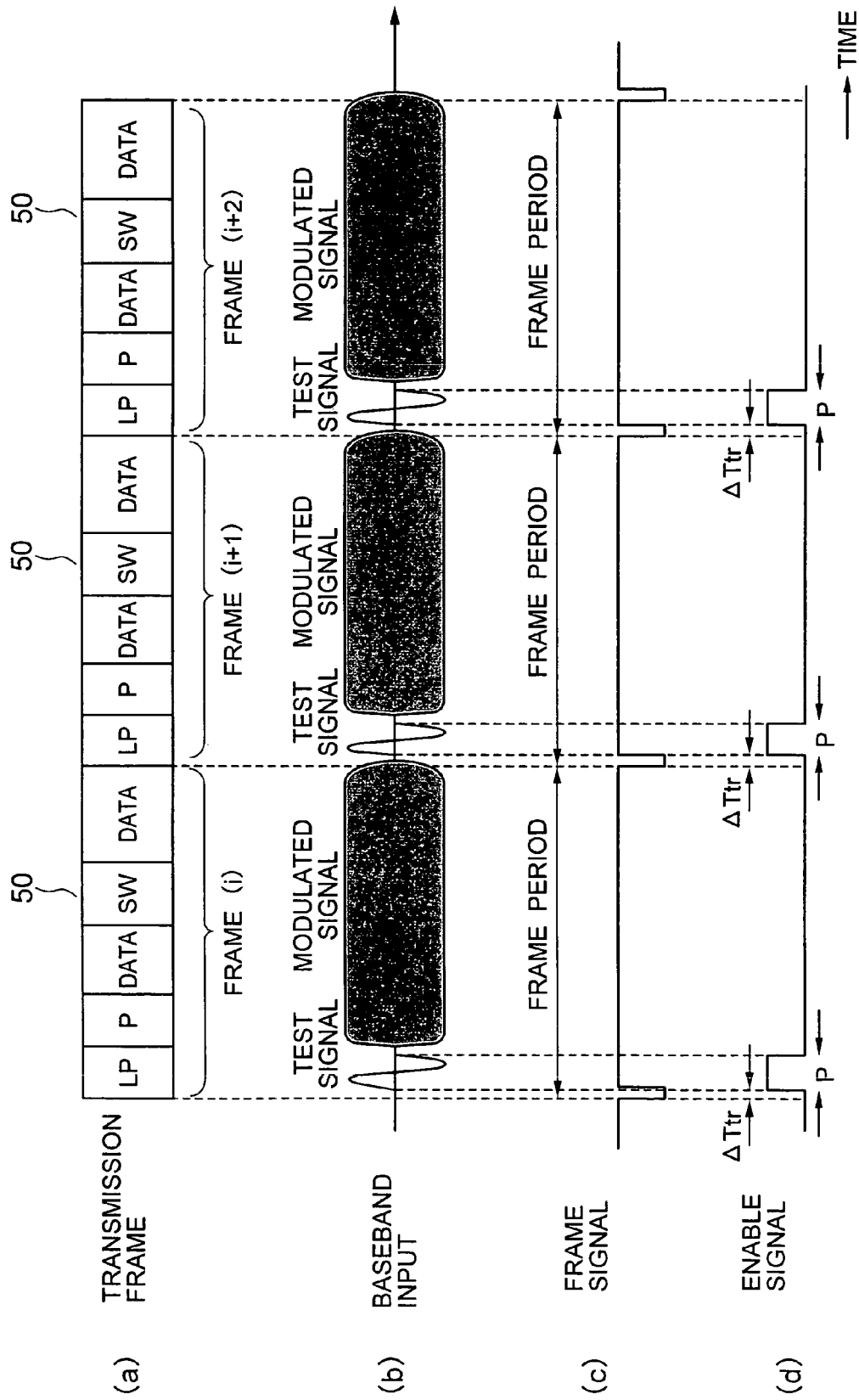
FIG. 8 is a chart for explaining examples of a transmission frame and a test timing.
Figure 9:
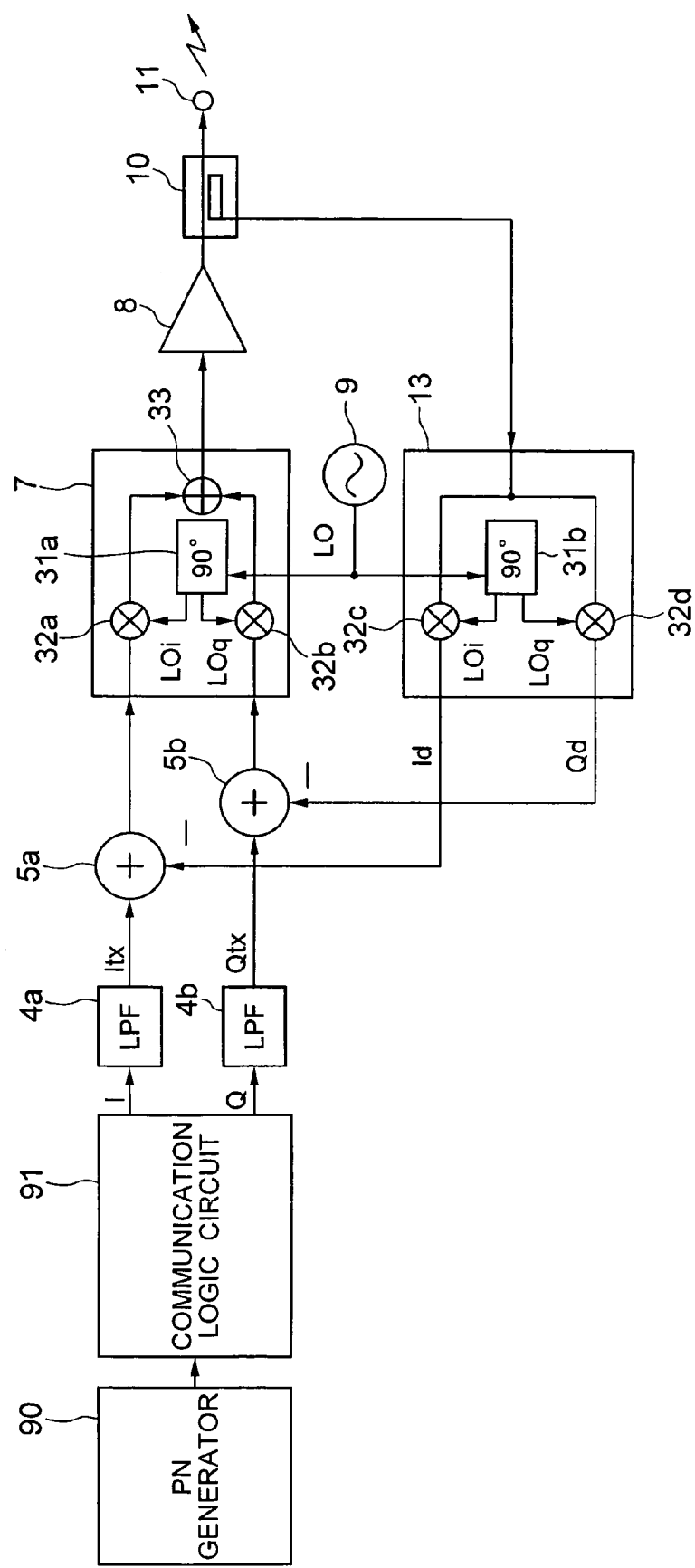
FIG. 9 is a block diagram showing an example of a conventional negative feedback amplifier.

The operation of the third embodiment will be described with an example of a transmission frame as shown in FIG. 8. The transmission frame 50 shown by (a) in FIG. 8 is composed of a linearizer preamble portion (LP), a preamble portion (P), a synchronous signal portion (SW), and a data portion. The linearizer preamble portion is a training timing interval placed at the head of the frame for the purpose of various trainings of the transmitter. The actual transmission signal in the transmission frame 50 is a portion of a modulated signal after the linearizer preamble portion (see (b) of FIG. 8). The preamble portion and the synchronous signal portion are the known fixed patterns to be transmitted for taking a timing synchronization with a receiver. The waveforms of the transmission frame (a) and the baseband signal (b) are generated according the timing signals (c) and (d) sent from the control unit 61. The transmission frame is built with the fall of the frame signal (c) shown in FIG. 8 as a starting trigger so that the testing signal and the modulated signal may be outputted at their predetermined timings. Further, the error detection is also executed according to the enable signal (d) sent from the control unit 61.

The correcting method to be executed with the linearizer preamble portion (LP) of the frame will be described as follows. For example, the testing I and Q signals represented in the preceding expressions (5) and (6) are inserted into the linearizer preamble portion (LP) of (a) of FIG. 8 (see (b) in FIG. 8). Further, the enable signal (d) (see FIG. 8) is inputted into the error detector 30. In this embodiment, the enable signal (d) is outputted as a frame at regular intervals p ΔTtr seconds later than the fall of the frame signal (c). The interval of the enable signal (d) indicates the interval when the testing signal takes place. The error detector 30 detects the errors (δ, κ) between the Im and the Qm signals at that time. Then, the correction (error value) of the vector corrector 2 is reset by the value detected when the linearizer preamble portion (LP) is ended, and the transmission of the transmission data is started.

Further, the description will explain correcting method to be executed through the use of the fact that the preamble portion and the synchronous signal portion are both composed of fixed patterns. At first, the method is executed to find the ideal relations of the phase and the amplitude between the I and the Q signals and the fixed patterns of the preamble portion or the synchronous signal portion and save the ideal relation as the reference data of the error detector 30. In operation, on the timing of the preamble portion or the synchronous signal portion of the transmission frame 50, the errors (δ, κ) are derived on the foregoing reference data. Then, the correction of the vector corrector 2 is set on the basis of the errors.

The correcting process on the training timing of the transmission frame or the timing of the known fixed patterns is executed at each transmission frame or at each intermittent transmission frame, that is, intermittently. This correcting process makes it possible to execute the correction as following the change of the errors of the quadrature demodulator 13 on time.

According to the present invention, in a case that a commercially available IC is used for the quadrature demodulator of the negative feedback amplifier, the invention makes it possible to realize a feedback amplifier which enables to improve the EVM and automatically correct the errors of the quadrature demodulator even after shipping the product of transmitter from the factory.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A negative feedback amplifier for a transmitter, comprising:

a vector corrector for correcting at least one of a phase and an amplitude of an in-phase component and a quadrature component of an input baseband signal containing data to be transmitted and outputting said corrected one;

an adder for adding a feedback signal of said in-phase component to said in-phase component of an output from said vector corrector and a feedback signal of said guadrature component to said quadrature component of said output from said vector corrector, respectively;

a modulator for orthogonally modulating said in-phase components and said guadrature components of outputs of said adder;

a power amplifier for amplifying an output of said modulator;

a demodulator for orthogonally demodulating a part of an output of said power amplifier and outputting said feedback signals of said in-phase component and said quadrature component, wherein said vector corrector performs a correcting operation of canceling an error of at least one of the phase and the amplitude of said in-phase component and said quadrature component occurring in said demodulator; and an error detecting unit, wherein when testing signals of the in-phase component and the quadrature component having a predetermined phase and amplitude is provided as said input baseband signal to said negative feedback amplifier, said error detecting unit performes a phase and amplitude comparisons between the in-phase component between said adders and said modulator and the in-phase component of said testing signal and between the quadrature component therebetween and the quadrature component thereof, and detects at least one of the phase error and the amplitude error by said comparison.

2. A negative feedback amplifier as claimed in claim 1, wherein said testing signal is a signal composed of a predetermined pattern, located at predetermined positions in the input baseband signal containing said data to be transmitted.

3. A negative feedback amplifier as claimed in claim 2, further comprising means for generating a signal for indicating a timing of said testing signal located at predetermined positions in said input baseband signal, and wherein said error correcting unit responds to a generation of said signal indicating the timing of said testing signal and reads the in-phase component and the quadrature component located between said adder and said modulator.

4. A negative feedback amplifier for a transmitter, comprising:
a vector corrector for correcting at least one of a phase and an amplitude of an in-phase component and a guadrature component of an input baseband signal containing data to be transmitted and outputting said corrected one;
an adder for adding a feedback signal of said in-phase component to said in-phase component of an output from said vector corrector and a feedback signal of said guadrature component to said quadrature component of said output from said vector corrector, respectively;
a modulator for orthogonally modulating said in-phase components and said guadrature components of outputs of said adder;
a power amplifier for amplifying an output of said modulator; and
a demodulator for orthogonally demodulating a part of an output of said power amplifier and outputting said feedback signals of said in-phase component and said quadrature component,
wherein said vector corrector performs a correcting operation of canceling an error of at least one of the phase and the amplitude of said in-phase component and said quadrature component occurring in said demodulator,
wherein assuming that the in-phase component of said input baseband signal is I, the quadrature component thereof is Q, the phase error is δ, and the amplitude error is κ, said vector corrector operates to correct said phase error and said amplitude error by the following expression of:

$Ic=I+\alpha Q$ $Qc=\beta Q$ wherein $\alpha=-\tan\delta$ and $\beta=1/(\kappa \cos\delta)$ and then to output the corrected in-phase component Ic and the corrected quadrature component Qc.

5. A transmitter comprising:
a baseband signal generating unit for generating an in-phase component and a guadrature component of a baseband signal containing data to be transmitted; and
a transmitting unit for modulating said data and thereby generating a transmission signal, based on the in-phase component and the quadrature component of said baseband signal sent from said baseband signal generating unit,
wherein said transmitting unit comprises:
a vector corrector for correcting at least one of a phase and an amplitude of the in-phase component and the quadrature component of said baseband signal sent from said baseband signal generating unit,
an adder for adding the in-phase component and the guadrature component of the output of said vector corrector to feedback signals of said in-phase component and said guadrature component, respectively,
a modulator for orthogonally modulating the in-phase components and the quadrature components of outputs of said adder,
a power amplifier for amplifying an output of said modulator, and
a demodulator for orthogonally demodulating a part of an output of said power amplifier and outputting said feedback signal of the in-phase component and the guadrature component,
wherein said vector corrector performs a correcting operation of canceling an error of at least one of the phase and the amplitude of the in-phase component and the guadrature component occurring in said demodulator, and
an error detecting unit,
wherein when a testing signal of the in-phase component and the quadrature component having a predetermined phase and amplitude values is provided as said input baseband signal to said negative feedback amplifier, said error detecting unit performs a phase and an amplitude comparison between the in-phase component between said adders and said modulator and the in-phase component of said testing signal and between the quadrature component therebetween and the quadrature component thereof, and detects at least one of a phase error and an amplitude error based on the compared results.

6. A transmitter as claimed in claim 5, wherein said testing signal is a signal of a predetermined pattern located at predetermined positions in said input baseband signal containing said data to be transmitted.

7. A transmitter as claimed in claim 6, wherein means for generating a signal indicating each timing of said testing signals located at predetermined positions in said input baseband signal, and said error detecting unit reads the in-phase component and the quadrature component between said adder and said modulator in response to a generation of said signal indicating each timing of said testing signals.

8. A transmitter comprising:
a baseband signal generating unit for generating an in-phase component and a guadrature component of a baseband signal containing data to be transmitted; and
a transmitting unit for modulating said data and thereby generating a transmission signal, based on the in-phase component and the guadrature component of said baseband signal sent from said baseband signal generating unit,
wherein said transmitting unit comprises;
a vector corrector for correcting at least one of a phase and an amplitude of the in-phase component and the guadrature component of said baseband signal sent from said baseband signal generating unit,
an adder for adding the in-phase component and the guadrature component of the output of said vector corrector to feedback signals of said in-phase component and said guadrature component, respectively, a modulator for orthogonally modulating the in-phase components and the guadrature components of outputs of said adder, a power amplifier for amplifying an output of said modulator, and a demodulator for orthogonally demodulating a part of an output of said power amplifier and outputting said feedback signal of the in-phase component and the quadrature component, wherein said vector corrector serving to perform a correcting operation of canceling an error of at least one of the phase and the amplitude of the in-phase component and the quadrature component occurring in said demodulator, wherein assuming that the in-phase component of said input baseband signal is I, the quadrature component thereof is Q, said phase error is δ, and said amplitude error is κ, then said vector corrector operates to correct said phase error and amplitude error by the following expressions:

$Ic = I + \alpha Q$ $Qc = \beta Q$ wherein $\alpha = -\tan \delta$ and $\beta = 1/(\kappa \cos \delta)$ and then to output the corrected in-phase component Ic and the corrected quadrature component Qc.

9. A method of correcting errors of a phase and an amplitude of a negative feedback amplifier included in a transmitter, said method comprising the steps of:

vector-correcting at least one of a phase and an amplitude of an in-phase component and a quadrature component of an input baseband signal containing data to be transmitted;

adding feedback signals of the in-phase component and the guadrature component to the corrected in-phase component and guadrature component, respectively;

orthogonally modulating said in-phase component and said quadrature component to which said feedback signals are added;

amplifying said orthogonally modulated signals;

orthogonally demodulating a part of said each amplified signal and then outputting said feedback signals of the in-phase component and the guadrature component; and in said correcting step, performing a correcting operation of canceling an error of at least one of the phase and amplitude of the in-phase component and the guadrature component occurring in said demodulator, when a test signal of the in-phase component and the quadrature component having a phase and an amplitude of a predetermined value as said input baseband signal is provided to the input unit of said negative feedback amplifier, comparing the phase and the amplitude between the in-phase component between said adding step and said quadrature modulating step and the in-phase component of said testing signal and between the quadrature component therebetween and the quadrature component thereof, and detecting at least one of a phase error and an amplitude error based on the compared result.

10. A method as claimed in claim 9, wherein said testing signal is a signal located at a predetermined position in said input baseband signal containing said data to be transmitted.

11. A method as claimed in claim 10, further comprising the steps of:

generating a signal indicating a timing of said testing signal located at a predetermined position in said input baseband signal when said input baseband signal is inputted; and reading the in-phase component and the quadrature component between said adding step and said quadrature modulating step in response to a generation of the signal indicating the timing of said testing signal.

12. A method of correcting errors of a phase and an amplitude of a negative feedback amplifier included in a transmitter, said method comprising the steps of:

vector-correcting at least one of a phase and an amplitude of an in-phase component and a guadrature component of an input baseband signal containing data to be transmitted;

adding feedback signals of the in-phase component and the guadrature component to the corrected in-phase component and guadrature component, respectively;

orthogonally modulating said in-phase component and said guadrature component to which said feedback signals are added;

amplifying said orthogonally modulated signals;

orthogonally demodulating a part of said each amplified signal and then outputting said feedback signals of the in-phase component and the guadrature component; and in said correcting step, performing a correcting operation of canceling an error of at least one of the phase and amplitude of the in-phase component and the guadrature component occurring in said demodulator, wherein assuming that the in-phase component of said input baseband signal is I, the quadrature component thereof is Q, the phase error thereof is δ, and the amplitude error thereof is κ, in said vector correcting step, the operation is executed to correct said phase error and amplitude error by the following expression of:

$Ic = I + \alpha Q$ $Qc = \beta Q$ wherein $\beta = -\tan \delta$ and $\beta = 1/(\kappa \cos \delta)$ and then to output the corrected in-phase component Ic and the corrected quadrature component Qc.

* * * * *